United States Patent
Tsutsumi et al.

(10) Patent No.: US 9,441,104 B2
(45) Date of Patent: Sep. 13, 2016

(54) HEAT-CURABLE EPOXY RESIN COMPOSITION FOR OPTICAL SEMICONDUCTOR ELEMENT ENCAPSULATION AND OPTICAL SEMICONDUCTOR DEVICE USING SAME

(71) Applicant: Shin-Etsu Chemical Co., Ltd., Tokyo (JP)

(72) Inventors: Yoshihiro Tsutsumi, Annaka (JP); Tadashi Tomita, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 14/957,274

(22) Filed: Dec. 2, 2015

(65) Prior Publication Data

US 2016/0160040 A1    Jun. 9, 2016

(30) Foreign Application Priority Data

Dec. 3, 2014 (JP) .................. 2014-244961
Dec. 3, 2014 (JP) .................. 2014-244962

(51) Int. Cl.

| | |
|---|---|
| *H01L 23/29* | (2006.01) |
| *C08G 59/20* | (2006.01) |
| *C08G 59/68* | (2006.01) |
| *C08L 63/00* | (2006.01) |
| *C08K 5/053* | (2006.01) |
| *C08L 53/00* | (2006.01) |

(52) U.S. Cl.
CPC ............... *C08L 63/00* (2013.01); *C08K 5/053* (2013.01); *C08L 53/00* (2013.01); *C08L 2205/025* (2013.01); *C08L 2205/03* (2013.01)

(58) Field of Classification Search
None
See application file for complete search history.

(56) References Cited

U.S. PATENT DOCUMENTS

2008/0187762 A1*  8/2008  Hayashi .......... B29C 45/02
                                                   428/413

FOREIGN PATENT DOCUMENTS

| JP | 7-309927 A | 11/1995 | | |
|---|---|---|---|---|
| JP | 9-213997 A | 8/1997 | | |
| JP | 2000-196151 A | 7/2000 | | |
| JP | 2002-302533 A | * 10/2002 | ............ | C08G 59/38 |
| JP | 2012-222229 A | * 11/2012 | ............ | H01L 23/29 |
| JP | 2013-023545 A | * 2/2013 | ............ | C08G 59/00 |
| KR | 10-2014-0009201 A | * 1/2014 | ............ | C08G 59/18 |

OTHER PUBLICATIONS

Machine translation of JP 2002-302533 A (no date).*
Machine translation of JP 2013-023545 A (no date).*
Machine translation of JP 2012-222229 A (no date).*
Machine translation of KR 10-2014-0009201 A (no date).*

* cited by examiner

*Primary Examiner* — Michael J Feely
(74) *Attorney, Agent, or Firm* — Birch, Stewart, Kolasch & Birch, LLP

(57) ABSTRACT

Provided are a heat-curable epoxy resin composition with a superior handling property, transparency and crack resistance; and an optical semiconductor device having an optical semiconductor element encapsulated by such composition. The composition includes:

(A) a prepolymer obtained by a reaction of (A-1), (A-2), (A-3) and (A-4) at an epoxy group equivalent/acid anhydride group equivalent ratio of 0.6 to 2.0, (A-1) being a triazine derivative epoxy resin, (A-2) being at least one selected from the group consisting of a bisphenol A-type epoxy resin, a bisphenol F-type epoxy resin, a hydrogenated bisphenol A-type epoxy resin and an alicyclic epoxy resin, (A-3) being an acid anhydride curing agent as a liquid at 50° C., and (A-4) being a flexibility imparting agent selected from the group consisting of a polycaprolactone polyol, a polycarbonate polyol and an acrylic block copolymer; and (B) a curing accelerator comprised of an onium salt represented by:

$$X^+Y^- \quad (1)$$

wherein $X^+$ represents a cation, and $Y^-$ represents an anion.

7 Claims, No Drawings

HEAT-CURABLE EPOXY RESIN COMPOSITION FOR OPTICAL SEMICONDUCTOR ELEMENT ENCAPSULATION AND OPTICAL SEMICONDUCTOR DEVICE USING SAME

TECHNICAL FIELD

The present invention relates to a heat-curable epoxy resin composition for optical semiconductor element encapsulation; and an optical semiconductor device having an optical semiconductor element encapsulated by such heat-curable epoxy resin composition.

BACKGROUND ART

Optical semiconductor elements such as LEDs (Light Emitting Diode) have been used as various indicators and light sources such as displays on the streets, automobile lamps and residential lightings. In fact, products employing optical semiconductor elements are being developed rapidly in various fields for the purpose of reducing carbon dioxide and saving energies.

An encapsulation material for encapsulating various optical semiconductor elements such as LEDs has to have a transparency, a moisture resistance, a heat resistance and a light resistance. Thus, as such encapsulation material, often used is a heat-curable epoxy resin (Patent document 1) employing both an epoxy resin such as a bisphenol A-type epoxy resin and/or an alicyclic epoxy resin; and an acid anhydride-based curing agent.

However, as a result of using a multifunctional epoxy resin and/or an alicyclic epoxy resin by simply melting the same to improve a heat resistance and a light resistance, a strength thereof as an encapsulation resin will decrease easily such that resin crack will occur easily as well if using such a kind of epoxy resin composition to encapsulate an optical semiconductor element (Patent documents 2 and 3).

Further, a lamp for use in an automobile or the like may be manufactured as follows. That is, an epoxy resin is used to encapsulate an optical semiconductor element on a lead frame in a lenticular manner, followed by proceeding to secondary molding where injection molding is performed on such lead frame with the aid of a thermoplastic resin. In such case, since the thermoplastic resin can only be molded when heated to 300° C. and under a high pressure, a low glass-transition temperature of the epoxy resin may cause the epoxy resin to reach a rubber state early such that the epoxy resin that has been poured into the lenticular section may be either washed away or separated from the lead frame.

PRIOR ART DOCUMENT

Patent Document

[Patent document 1] Japanese Unexamined Patent Application Publication No. Hei 7-309927
[Patent document 2] Japanese Unexamined Patent Application Publication No. Hei 9-213997
[Patent document 3] Japanese Unexamined Patent Application Publication No. 2000-196151

SUMMARY OF THE INVENTION

Problem to be Solved by the Invention

The present invention has been made to solve the aforementioned problems, and it is an object of the present invention to provide a heat-curable epoxy resin composition for optical semiconductor element encapsulation which not only enables transfer molding due to its favorable handling property as being a solid at a room temperature, but also results in a molded product exhibiting a superior transparency, a high strength at a room temperature, a superior crack resistance and a smaller decrease in the glass-transition temperature as compared to when a conventional flexibility imparting agent is added. Further, it is also an object of the present invention to provide an optical semiconductor device having an optical semiconductor element encapsulated by the abovementioned composition.

Means to Solve the Problem

In order to solve the abovementioned problems, the inventors of the present invention diligently carried out studies after studies to find that the following heat-curable epoxy resin composition was the type of optical semiconductor element encapsulation resin capable of achieving the aforesaid objectives. The present invention was thus made.

Specifically, the present invention is to provide the following heat-curable epoxy resin composition for optical semiconductor element encapsulation; and an optical semiconductor device using the same.

[1]
A heat-curable epoxy resin composition for optical semiconductor element encapsulation, including:
(A) a prepolymer obtained by a reaction of components (A-1), (A-2), (A-3) and (A-4) at an epoxy group equivalent/acid anhydride group equivalent ratio of 0.6 to 2.0,
(A-1) being a triazine derivative epoxy resin having not less than 3 epoxy groups in one molecule,
(A-2) being at least one epoxy resin selected from the group consisting of a bisphenol A-type epoxy resin, a bisphenol F-type epoxy resin, a hydrogenated bisphenol A-type epoxy resin and an alicyclic epoxy resin,
(A-3) being an acid anhydride curing agent in liquid form at 50° C., and
(A-4) being a flexibility imparting agent selected from the group consisting of a polycaprolactone polyol, a polycarbonate polyol and an acrylic block copolymer; and
(B) a curing accelerator comprised of an onium salt represented by the following formula 1:

[Chemical formula 1]

$$X^+Y^- \qquad (1)$$

wherein $X^+$ represents a cation selected from the group consisting of an aliphatic quaternary phosphonium ion, an aromatic quaternary phosphonium ion, an onium ion of 1,8-diaza-bicyclo[5.4.0]undeca-7-ene and an onium ion of an imidazole derivative, and $Y^-$ represents an anion selected from the group consisting of a tetrafluoroborate ion, a tetraphenylborate ion, a hexafluorophosphate ion, a bistrifluoromethylsulfonyl imide acid ion, a tris(trifluoromethylsulfonyl)carbonate ion, a trifluoromethanesulfonate ion, a halogenated acetic acid ion, a carboxylate ion and a halogen ion, wherein
(A-2) is added in an amount of 11 to 100 parts by mass with respect to 100 parts by mass of (A-1); (A-4) is added in an amount of 2 to 20 parts by mass with respect to 100 parts by mass of a total sum of (A-1), (A-2) and (A-3); and the component (B) is added in an amount of 0.05 to 5 parts by mass with respect to 100 parts by mass of a total sum of (A-1), (A-2), (A-3) and (A-4).

[2]
The heat-curable epoxy resin composition for optical semiconductor element encapsulation according to [1], wherein the curing accelerator as the component (B) is a phosphonium salt.

[3]
An optical semiconductor device having an optical semiconductor element encapsulated by the heat-curable epoxy resin composition for optical semiconductor element encapsulation as set forth in [1] or [2].

[4]
A method for manufacturing an optical semiconductor device, including a step of encapsulating an optical semiconductor element through transfer molding, using the heat-curable epoxy resin composition for optical semiconductor element encapsulation as set forth in [1] or [2].

[5]
A method for producing a heat-curable epoxy resin composition for optical semiconductor element encapsulation, including:
a step of obtaining a prepolymer (A) by a reaction of components (A-1), (A-2), (A-3) and (A-4) at an epoxy group equivalent/acid anhydride group equivalent ratio of 0.6 to 2.0,
(A-1) being a triazine derivative epoxy resin having not less than 3 epoxy groups in one molecule,
(A-2) being at least one epoxy resin selected from the group consisting of a bisphenol A-type epoxy resin, a bisphenol F-type epoxy resin, a hydrogenated bisphenol A-type epoxy resin and an alicyclic epoxy resin,
(A-3) being an acid anhydride curing agent in liquid form at 50° C., and
(A-4) being a flexibility imparting agent selected from the group consisting of a polycaprolactone polyol, a polycarbonate polyol and an acrylic block copolymer; and
a step of adding to the prepolymer (A) a curing accelerator (B) comprised of an onium salt represented by the following formula 1:

[Chemical formula 2]

$$X^+Y^- \quad (1)$$

wherein r represents a cation selected from the group consisting of an aliphatic quaternary phosphonium ion, an aromatic quaternary phosphonium ion, an onium ion of 1,8-diaza-bicyclo[5.4.0]undeca-7-ene and an onium ion of an imidazole derivative, and $Y^-$ represents an anion selected from the group consisting of a tetrafluoroborate ion, a tetraphenylborate ion, a hexafluorophosphate ion, a bistrifluoromethylsulfonyl imide acid ion, a tris(trifluoromethylsulfonyl)carbonate ion, a trifluoromethanesulfonate ion, a halogenated acetic acid ion, a carboxylate ion and a halogen ion, wherein (A-2) is added in an amount of 11 to 100 parts by mass with respect to 100 parts by mass of (A-1); (A-4) is added in an amount of 2 to 20 parts by mass with respect to 100 parts by mass of a total sum of (A-1), (A-2) and (A-3); and the curing accelerator (B) is added in an amount of 0.05 to 5 parts by mass with respect to 100 parts by mass of a total sum of (A-1), (A-2), (A-3) and (A-4).

Effect of the Invention

According to the present invention, provided is a heat-curable epoxy resin composition for optical semiconductor element encapsulation which is superior in handling property, transparency and crack resistance. Particularly, by employing a polycarbonate polyol or acrylic block copolymer as a flexibility imparting agent, the invention can provide a heat-curable epoxy resin composition for optical semiconductor element encapsulation which exhibits a smaller decrease in a glass-transition temperature as compared to when a conventional flexibility imparting agent is added.

Further, the present invention is also able to provide an optical semiconductor device having an optical semiconductor element that is encapsulated by the abovementioned composition. Furthermore, there is provided a method for manufacturing an optical semiconductor device by performing transfer molding on an optical semiconductor element using the abovementioned composition.

MODE FOR CARRYING OUT THE INVENTION

Described in detail hereunder are a heat-curable epoxy resin composition of the present invention for encapsulating an optical semiconductor element(s); and an optical semiconductor device using the same. However, the invention is not limited to the following examples.

<Heat-Curable Epoxy Resin Composition for Optical Semiconductor Element Encapsulation>

(A) Prepolymer

A prepolymer as a component (A) is obtained by the reaction of components (A-1), (A-2), (A-3) and (A-4) at an epoxy group equivalent/acid anhydride group equivalent ratio of 0.6 to 2.0. Particularly, (A-1) is a triazine derivative epoxy resin having not less than 3 epoxy groups in one molecule; (A-2) is at least one epoxy resin selected from the group consisting of a bisphenol A-type epoxy resin, a bisphenol F-type epoxy resin, a hydrogenated bisphenol A-type epoxy resin and an alicyclic epoxy resin; (A-3) is an acid anhydride curing agent in liquid form at 50° C.; and (A-4) is a flexibility imparting agent selected from the group consisting of a polycaprolactone polyol, a polycarbonate polyol and an acrylic block copolymer.

(A-1) Triazine Derivative Epoxy Resin Having Not Less than 3 Epoxy Groups in One Molecule The triazine derivative epoxy resin as the component (A-1) of the present invention has not less than 3 epoxy groups in one molecule. This triazine derivative epoxy resin is then reacted with the epoxy resin as the component (A-2), the acid anhydride curing agent as the component (A-3) and the flexibility imparting agent as the component (A-4) at a given ratio to obtain a reactant. By employing such reactant as a resin component, there can be obtained a semiconductor light emitting device exhibiting an improved strength of a cured product of a heat-curable epoxy resin composition at the time of heating, a restricted yellowing and a small degree of degradation with time.

One favorable example of such triazine derivative epoxy resin is a 1,3,5-triazine nucleus derivative epoxy resin. Especially, an epoxy resin having an isocyanurate ring is superior in light resistance and electrical insulation, and it is preferred that such epoxy resin be that having a divalent epoxy group, more preferably a trivalent epoxy group with respect to one isocyanurate ring. Specific examples thereof include tris(2, 3-epoxypropyl)isocyanurate, tris(α-methylglycidyl)isocyanurate and the like.

It is preferred that the triazine derivative epoxy resin of the present invention have a softening point of 40 to 125° C., more preferably 90 to 120° C. However, those having hydrogenated triazine rings are not included as the triazine derivative epoxy resin of the present invention.

(A-2) Given Epoxy Resin

Other than the triazine derivative epoxy resin as the component (A-1) of the present invention, used as the epoxy resin of the component (A-2) is at least one epoxy resin selected from the group consisting of a bisphenol A-type epoxy resin, a bisphenol F-type epoxy resin, a hydrogenated bisphenol A-type epoxy resin and an alicyclic epoxy resin.

The component (A-1) and the later-described component (A-3) alone may often make it difficult to perform pressure molding at a room temperature, and also result in a poor mechanical strength. By adding the component (A-2), a handling property and a prepolymerization can be improved. In terms of such handling property and an ease of prepolymerization, it is preferred that the component (A-2) be either in the form of a solid or non-fluid at a room temperature, and have a softening point of 30 to 100° C.

It is preferred that the component (A-2) be added in an amount of 11 to 100 parts by mass, particularly 20 to 80 parts by mass with respect to 100 parts by mass of the component (A-1). Further, it is preferred that the component (A-2) be either in the form of a solid or non-fluid at a room temperature. When the component (A-2) is in an amount smaller than 11 parts by mass with respect to 100 parts by mass of the component (A-1), it is often difficult to perform pressure molding at a room temperature as described above. Meanwhile, an amount larger than 100 parts by mass may lead to an unfavorable heat resistance and light resistance.

(A-3) Acid Anhydride as Liquid at 50° C.

The acid anhydride as the component (A-3) of the present invention is in liquid form at 50° C., and serves as a curing agent. It is preferred that such acid anhydride be non-aromatic and have no carbon-carbon double bond for the purpose of imparting a light resistance. Here, an acid anhydride that is in the form of a solid at 50° C. most often has an aromatic ring and/or a carbon-carbon double bond. Examples of an acid anhydride that is in liquid form at 50° C. include hexahydrophthalic acid anhydride, methylhexahydrophthalic acid anhydride, trialkyltetrahydrophthalic acid anhydride and hydrogenated methylnadic anhydride, among which hexahydrophthalic acid anhydride and/or methylhexahydrophthalic acid anhydride are preferred. Here, one or more kinds of these acid anhydride-based curing agents may be used in combination.

(A-4) Flexibility Imparting Agent

In order to improve the strength and crack resistance of a cured product at a room temperature, a polycaprolactone polyol, a polycarbonate polyol or an acrylic block copolymer is added, as the flexibility imparting agent of the component (A-4), to the heat-curable epoxy resin composition of the present invention.

A caprolactone polyol added as the component (A-4) in the present invention is a polymer employing ε-caprolactone as a raw material, having not less than 2 hydroxyl groups in one molecule and exhibiting a number average molecular weight of not smaller than 200. Here, one or more kinds of such polycaprolactone polyols may be used in combination. It is sufficient that the polycaprolactone polyol have a number average molecular weight of not smaller than 200. Although not restricted, it is preferred that such number average molecular weight be 200 to 100,000, more preferably 300 to 10,000. When this number average molecular weight is smaller than 200, the strength and crack resistance of the cured product may not be improved. Meanwhile, a number average molecular weight greater than 100,000 may lead to a significant decrease in a compatibility with the epoxy resin(s). In fact, the number average molecular weight of the component (A-4) refers to a number average molecular weight in terms of polystyrene, measured by gel permeation chromatography (GPC).

While the hydroxyl group(s) in the caprolactone polyol may be an alcoholic hydroxyl group and/or a phenolic hydroxyl group, an alcoholic hydroxyl group is more preferable for the purpose of avoiding aromatic series-induced discoloration, and due to the fact that a rapid reaction with the acid anhydride curing agent as the component (A-3) is thus possible. Although not restricted, it is sufficient that the caprolactone polyol as the component (A-4) have not less than 2 hydroxyl groups in one molecule. Further, although there are no particular restrictions on the positions of such hydroxyl groups, it is preferred that these hydroxyl groups be present at a terminal end of the polymer main chain, more preferably at both terminal ends thereof in terms of the reaction with the acid anhydride curing agent.

Although not restricted, it is preferred that the caprolactone polyol as the component (A-4) have a hydroxyl value of 30 to 600 mg KOH/g, more preferably 50 to 550 mg KOH/g. A hydroxyl value of lower than 30 mg KOH/g may lead to an excessively low glass-transition temperature (Tg) of the cured product. Meanwhile, a hydroxyl value greater than 600 mg KOH/g may cause the crack resistance to be impaired. Here, the hydroxyl value of the component (A-4) is measured by a method described in JIS K1557-1.

In fact, the polycaprolactone polyol as the component (A-4) may be selected from those that are commercially available. Although not limited, there can be used the following commercial products bearing the following product names (by Daicel Corporation). These products include PLACCEL 205U, PLACCEL L 205 AL, PLACCEL L 208 AL, PLACCEL L 212 AL, PLACCEL L 220 AL, PLACCEL L 230 AL, PLACCEL 220 ED, PLACCEL 220 EC, PLACCEL 220 EB, PLACCEL 303, PLACCEL 305, PLACCEL 308, PLACCEL 312, PLACCEL L 312 AL, PLACCEL 320, PLACCEL L 320 AL, PLACCEL 410, PLACCEL 410D, PLACCEL P3403, PLACCEL E227, PLACCEL DC2009, PLACCEL DC2016, PLACCEL DC2209 and the like.

The polycarbonate polyol as the component (A-4) is a polycarbonate polyol having not less than 2 hydroxyl groups in one molecule. While the hydroxyl group(s) in the polycarbonate polyol may be an alcoholic hydroxyl group and/or a phenolic hydroxyl group, an alcoholic hydroxyl group is more preferable for the purpose of avoiding aromatic series-induced discoloration, and due to the fact that a rapid reaction with the acid anhydride curing agent as the component (A-3) is thus possible.

Further, one or more kinds of such polycarbonate polyols may be used in combination.

It is sufficient that the polycarbonate polyol as the component (A-4) have a number average molecular weight of not smaller than 200. Although not restricted, it is preferred that such number average molecular weight be 200 to 10,000, more preferably 300 to 5,000. When this number average molecular weight is smaller than 200, the strength and crack resistance of the cured product may not be improved. Meanwhile, a number average molecular weight greater than 10,000 may lead to a significant decrease in the compatibility with the epoxy resin(s).

As the polycarbonate polyol of the component (A-4), there can be used the following commercially available products. Examples of these products include PLACCEL CD205, CD210, CD220, CD205PL, CD205HL, CD210PL, CD210HL, CD220PL, CD220HL, CD220EC and CD221T (all by Daicel Corporation); ETERNACOLL UH-CARB50, UH-CARB100, UH-CARB300, UH-CARB90 (1/3), UH-CARB90 (1/1) and UH-CARB100 (all by UBE INDUS- TRIES, LTD.); DURANOL T6002, T5652, T4672, T4692 and G3452 (all by Asahi Kasei Chemicals Corporation); and Kuraray Polyol ND and MPD (all by KURARAY CO., LTD).

The acrylic block copolymer as the component (A-4) is a block copolymer employing an acrylic monomer as an essential monomer component. Examples of such acrylic monomer include a (meth)acrylic acid alkyl ester such as methyl acrylate, ethyl acrylate, n-butyl acrylate, t-butyl acrylate, methyl methacrylate, ethyl methacrylate, n-butyl methacrylate, t-butyl methacrylate and stearyl methacrylate; a (meth)acrylic acid ester having an alicyclic structure, such as cyclohexyl acrylate and cyclohexyl methacrylate; a (meth)acrylic acid ester having an aromatic ring(s), such as benzyl methacrylate; a carboxyl group-containing acrylic monomer having a carboxyl group(s) in the molecules, such as acrylic acid, methacrylic acid and maleic acid; a hydroxyl group-containing acrylic monomer having a hydroxyl group(s) in the molecules, such as 2-hydroxyethyl acrylate, 2-hydroxypropyl acrylate, 4-hydroxybutyl acrylate, 2-hydroxyethyl methacrylate, 2-hydroxypropyl methacrylate, 4-hydroxybutyl methacrylate and a mono (meth)acrylic acid ester of glycerin; an acrylic monomer having an epoxy group(s) in the molecules, such as glycidyl methacrylate, methylglycidyl methacrylate and 3,4-epoxycyclohexylmethyl methacrylate; an allyl group-containing acrylic monomer having an allyl group(s) in the molecules, such as allyl acrylate and allyl methacrylate; a silane group-containing acrylic monomer having a hydrolyzable group(s) in the molecules, such as γ-methacryloyloxypropyl trimethoxysilane and γ-methacryloyloxypropyl triethoxysilane; and an ultraviolet absorbing acrylic monomer having a benzotriazole-based ultraviolet absorbing group(s), such as 2-(2'-hydroxy-5'-methacryloxyethylphenyl)-2H-benzotriazole.

In addition to the abovementioned acrylic monomers, monomers other than these acrylic monomers may also be used in the acrylic block copolymer as the component (A-4). Examples of monomers other than the aforementioned acrylic monomers include an aromatic vinyl compound such as styrene and α-methylstyrene; a conjugated diene such as butadiene and isoprene; and an olefin such as ethylene and propylene.

The acrylic block copolymer as the component (A-4) can be produced by a known or common method for producing a block copolymer. As a method for producing the abovementioned acrylic block copolymer, living polymerization (e.g. living radical polymerization, living anionic polymerization and living cationic polymerization) is particularly preferred due to an ease of controlling the molecular weight, molecular weight distribution and terminal end structure of the acrylic block copolymer. Here, such living polymerization can be carried out through a known or common method.

Further, as the acrylic block copolymer of the component (A-4), there may be used a commercially available product such as Nanostrength M52N, M22N, M51, M52, M53 (all by ARKEMA group, PMMA-b-PBA-b-PMMA).

It is preferred that the flexibility imparting agent as the component (A-4) be added in an amount of 2 to 20 parts by mass, especially 2.5 to 10 parts by mass with respect to 100 parts by mass of a total sum of the components (A-1), (A-2) and (A-3). When the component (A-4) is in an amount of smaller than 2 parts by mass, there may not be achieved the desired strength and crack resistance. Meanwhile, an amount of larger than 20 parts by mass may lead to a poor heat and light resistances of the cured product of the epoxy resin composition and an extremely slow rate at which curing takes place at the time of performing molding. In addition, when the amount of the component (A-4) is larger than 20 parts by mass, discoloration and turbidity may occur immediately after performing molding, and the glass-transition temperature of the cured product may become excessively low.

The component (A) is a prepolymer obtained by a reaction carried out at the epoxy group equivalent/acid anhydride group equivalent ratio of 0.6 to 2.0. That is, all the epoxy groups in (A-1) and (A-2) are present in an amount of 0.6 to 2.0 mol, preferably 0.8 to 1.8 mol, more preferably 1.0 to 1.6 mol with respect to 1 mol of the acid anhydride groups of (A-3). When (molar number of all epoxy groups)/(molar number of acid anhydride) is smaller than 0.6, an unreacted curing agent may remain in the cured product such that a moisture resistance of the cured product obtained may be impaired, and solidification may become difficult under a room temperature even after performing prepolymerization. Moreover, when (molar number of all epoxy groups)/(molar number of acid anhydride) is greater than 2.0, curing failures may occur such that a reliability may decrease.

The aforementioned prepolymer can be synthesized by a reaction of the components (A-1), (A-2), (A-3) and (A-4) at 60 to 120° C., preferably 70 to 110° C., for 3 to 20 hours, preferably 4 to 15 hours. At that time, the component (A-3) and either one of the components (A-1) and (A-2) may be prepolymerized in advance, followed by adding the reset of the components thereto. The later-described components may also be further added to produce the target resin. In fact, such components may be added in any order.

In this way, obtained is a prepolymer as a solid product having a softening point of 40 to 100° C., preferably 50 to 80° C. When the softening point of the substance obtained through the reaction is lower than 40° C., it is difficult to form a solid, and then perform pressure molding at a room temperature. Meanwhile, a softening point of higher than 100° C. may cause gelatinization to take place extremely intensively such that the composition may exhibit an extremely low required fluidity at the time of performing molding.

(B) Curing Accelerator

A curing accelerator as a component (B) is added to cure the heat-curable epoxy resin. In the present invention, there is used an onium salt represented by the following formula (1).

[Chemical formula 3]

$$X^+Y^- \tag{1}$$

In the above formula (1), $X^-$ represents a cation selected from the group consisting of an aliphatic quaternary phosphonium ion, an aromatic quaternary phosphonium ion, an onium ion of 1,8-diaza-bicyclo[5.4.0]undeca-7-ene and an onium ion of an imidazole derivative. Further, $Y^-$ represents an anion selected from the group consisting of a tetrafluoroborate ion, a tetraphenylborate ion, a hexafluorophosphate ion, a bistrifluoromethylsulfonyl imide acid ion, a tris(trifluoromethylsulfonyl)carbonate ion, a trifluoromethanesulfonate ion, a halogenated acetic acid ion, a carboxylate ion and a halogen ion.

As the curing accelerator of the component (B), a phosphonium salt is preferred in terms of heat resistance and property of coloring the cured product.

It is preferred that the curing accelerator as the component (B) be added in an amount of 0.05 to 5% by mass, especially 0.1 to 2% by mass with respect to a total sum of the component (A). An amount out of these ranges may lead to a poor balance between the heat resistance and the moisture resistance of the cured product of the epoxy resin composition, and result in an extremely slow or fast rate at which curing takes place when performing molding.

Although the aforementioned onium salt is used as the component (B), it may also be used in conjunction with an other curing accelerator(s) for epoxy resin. Examples of such other curing accelerator(s) include tertiary amines such as 1,8-diaza-bicyclo[5.4.0]undeca-7-ene, triethylenediamine and tri-2,4,6-dimethylaminomethylphenol; imidazoles such as 2-ethyl-4 methylimidazole and 2-methylimidazole; a quaternary phosphonium salt such as triphenylphosphine and tetra-n-butylphosphonium-o,o-diethyl phosphorodithiolate; a quaternary ammonium salt; organometallic salts; and the derivatives of these compounds. Here, one or more kinds of these curing accelerators may be used in combination.

In addition to the components (A) and (B), an antioxidant (C), a mold release agent (D), a coupling agent (E), a reinforcing material (F) and other components may also be added to the composition of the present invention if necessary, provided that the transparency and crack resistance of the cured product of the heat-curable epoxy resin composition will not be impaired in such case.

(C) Antioxidant

An antioxidant (C) can be added to the heat-curable epoxy resin composition of the present invention for the purpose of improving an initial transmission and maintaining a transmission in the long term. As such antioxidant (C), there may be used a phenolic antioxidant, a phosphorous antioxidant and a sulfur-based antioxidant. Specific examples of the antioxidant (C) are as follows.

That is, examples of a phenolic antioxidant include 2,6-di-t-butyl-p-cresol, butylated hydroxyanisole, 2,6-di-t-butyl-p-ethylphenol, stearyl-β-(3,5-di-t-butyl-4-hydroxyphenyl)propionate, 2,2'-methylenebis(4-methyl-6-t-butylphenol), 4,4'-butylidenebis(3-methyl-6-t-butylphenol), 3,9-bis[1,1-dimethyl-2-{β-(3-t-butyl-4-hydroxy-5-methylphenyl)propionyloxy}ethyl]2,4,8,10-tetraoxaspiro[5,5]undecane, 1,1,3-tris(2-methyl-4-hydroxy-5-t-butylphenyl)butane and 1,3,5-trimethyl-2,4,6-tris(3,5-di-t-butyl-4-hydroxybenzyl)benzene.

Examples of a phosphorous antioxidant include triphenyl phosphite, diphenylalkyl phosphite, phenyldialkyl phosphite, tri(nonylphenye phosphite, trilauryl phosphite, trioctadecyl phosphite, triphenyl phosphite, distearyl pentaerytlritol diphosphite, tris(2,4-di-tert-butylphenyl)phosphite, diisodecyl pentaerythritol diphosphite, di (2,4-di-tert-butylphenyl)pentaerythritol diphosphite, tristearylsorbitol triphosphite and tetrakis(2,4-di-tert-butylphenyl)-4,4'-biphenyl diphosphonate.

Examples of a sulfur-based antioxidant include dilauryl thiopropionate, distearyl thiopropionate, dibenzyl disulfide and trisnonylphenyl phosphite.

In fact, one or more kinds of these antioxidants may be used in combination. It is preferred that such antioxidant(s) be added in an amount of 0.01 to 10% by mass, especially 0.03 to 8% by mass with respect to the component (A). When the antioxidant(s) added are in an excessively small amount, there may not be achieved a sufficient heat resistance and light resistance such that discoloration may occur. Meanwhile, an excessively large amount of the antioxidant(s) may lead to a curing inhibition such that sufficient curability and strength may not be achieved and that the cured product may discolor due to the deterioration of the antioxidant(s) themselves.

(D) Mold Release Agent

A mold release agent may be added to the epoxy resin composition of the present invention for the purpose of improving a mold releasing property at the time of performing molding.

As such mold release agent, there are known a natural wax such as carnauba wax, an acid wax, a polyethylene wax and a synthetic wax such as fatty acid ester. However, when exposed to a high temperature and/or light irradiation, many of them are often susceptible to yellowing and may deteriorate with time such that their mold releasing properties will be lost. Further, a mold release agent will usually exude to the surface of a resin. That is, the transparency of the cured product is often impaired significantly even when a mold release agent is used in a small amount. Accordingly, as such mold release agent, a glycerin derivative and fatty acid ester are preferred.

It is preferred that the mold release agent (D) be added in an amount of 0.20 to 10.0 parts by mass, especially 1.0 to 7.0 parts by mass with respect to 100 parts by mass of the total sum of the component (A). When the mold release agent (D) added is in an amount of smaller than 0.20 parts by mass, there may not be achieved a sufficient mold releasing property. Meanwhile, an amount greater than 10.0 parts by mass may lead to an insufficient transparency, bleeding failures and adhesion failures or the like.

(E) Coupling Agent

A coupling agent such as a silane coupling agent and a titanate coupling agent may be added to the epoxy resin composition of the present invention for the purpose of improving an adhesion strength to a metal base material such as a lead frame.

Examples of such coupling agent include an epoxy functional alkoxysilane such as γ-glycidoxypropyltrimethoxysilane, γ-glycidoxypropylmethyldiethoxysilane and β-(3,4-epoxycyclohexyl)ethyltrimethoxysilane; and a mercapto functional alkoxysilane such as γ-mercaptopropyltrimethoxysilane. However, those causing a thermal resin to discolor when left under a temperature of not lower than 150° C. are not preferable as is the case with an amine-based silane coupling agent.

It is preferred that the component (E) be added in an amount of 0.05 to 2.0% by mass, especially 0.1 to 1.5% by mass with respect to the component (A). When the component (E) added is in an amount of smaller than 0.05% by mass, an adhesion effect to the base material will be insufficient. Meanwhile, an amount of greater than 2.0% by mass may lead to an extremely low viscosity, which can be the cause of voids.

(F) Reinforcing Material

A reinforcing material as a component (F) may be added to the heat-curable epoxy resin composition of the present invention for the purpose of further improving the strength under a room temperature and when being heated, and for the purpose of controlling cracks at the time of performing molding.

As such reinforcing material, there can be used those that are normally added to an epoxy resin composition. The kinds of such reinforcing material include those of silicas such as a molten silica and a crystalline silica; alumina; silicon nitride; aluminum nitride; glass fibers and the like. Further, it is preferred that the size of these reinforcing materials be that of a nanofiller where the particle diameter thereof is in nano order. Here, glass fibers are preferred due to the fact that the difference between the refractive index of a glass fiber and that of the cured product is small, where a glass fiber having a low impurity concentration is more preferred.

An average diameter of such glass fiber is 5.0 to 25.0 µm, preferably 8.0 to 15.0 µm. When this average diameter is extremely small, a reinforcement effect on the cured product may be small as well such that the mechanical strength of the cured product cannot be improved sufficiently. Meanwhile, an extremely large average diameter may result in an inhomogeneous appearance of the cured product.

An average length of such glass fiber is 50 to 400 µm, preferably 60 to 300 µm. When this average length is extremely small, the reinforcement effect on the cured product may be small as well such that the mechanical strength of the cured product cannot be improved sufficiently. Meanwhile, an extremely large average length may cause a runner section and/or a gate section of a mold to be clogged at the time of performing molding, and result in an inhomogeneous appearance of the cured product.

The component (F) is added in an amount of not more than 15% by mass with respect to the component (A). An excessively large amount of the component (F) may cause the transparency of the cured product to decrease significantly such that a desired light extraction efficiency may not be achieved.

<Production Method of Heat-Curable Epoxy Composition for Optical Semiconductor Element Encapsulation>

While there are no particular restrictions on a method for producing the heat-curable epoxy composition of the present invention, the following method can, for example, be employed. In the beginning, the components (A-1), (A-2), (A-3) and (A-4) are combined with one another at a given composition ratio, followed by heating and mixing the same through a gate mixer or the like to obtain the prepolymer as the component (A). Next, the prepolymer as the component (A) and the component (B); and, if necessary, the additives as the components (C) to (F) and the like are melted together at a given ratio, followed by cooling and solidifying the same. A product thus obtained is then crushed into pieces of an appropriate size, thus obtaining a molding material of the heat-curable epoxy resin composition. In fact, the components can be thrown in in any order. For example, the component (C) or the like may have already been thrown in at the time of performing prepolymerization on the component (A).

Moreover, the molding material of the epoxy resin composition may also be prepared as follows. That is, only the component (A) is prepolymerized in advance, followed by cooling and solidifying the same. A solidified product thus obtained is then crushed into pieces of an appropriate size. Next, the curing accelerator as the component (B); and, if necessary, the other additives are combined with the crushed product at a given composition ratio. A mixer or the like is then used to mix the combined product to a sufficiently uniform level, followed by melting and mixing the same through a heat roll, a kneader, an extruder or the like. A product thus obtained is then cooled and solidified, followed by crushing the same into pieces of an appropriate size, thus obtaining the molding material of the epoxy resin composition.

Optical semiconductor element encapsulation using the heat-curable epoxy resin composition of the present invention can be performed through a known molding method such as transfer molding. A transfer molding method requires a transfer molding machine, and it is preferred that transfer molding be performed under a condition of molding pressure: 5 to 20 N/mm$^2$/molding temperature: 120 to 190° C./molding time: 30 to 500 sec, especially a condition of molding temperature: 150 to 185° C./molding time: 90 to 300 sec. In addition, post curing may be performed at 150 to 185° C. for 0.5 to 20 hours.

WORKING EXAMPLE

The present invention is described in detail hereunder with reference to working and comparative examples. However, the present invention is not limited to the following working examples.

The materials and methods that were used in the working and comparative examples are as follows.
(A) Prepolymer
  (A-1) Triazine derivative epoxy resin having not less than 3 epoxy groups in one molecule
    (A-1-1) Tris(2,3-epoxypropyl)isocyanurate (product name: TEPIC-S by Nissan Chemical Industries, Ltd., epoxy equivalent 100)
  (A-2) Specific epoxy resin
    (A-2-1) Solid bisphenol A-type epoxy resin (product name: jER-1001 by Mitsubishi Chemical Corporation, epoxy equivalent 475)
    (A-2-2) Solid alicyclic epoxy resin (product name: EHPE-3150 by Daicel Corporation, epoxy equivalent 170)
  (A-3) Acid anhydride
    (A-3-1) Methylhexahydrophthalic anhydride (product name: RIKACID MH by New Japan Chemical Co., Ltd., acid anhydride equivalent 168, melting point 22° C.)
    (A-3-2) 1,2,3,6-tetrahydrophthalic anhydride (product name: RIKACID TH by New Japan Chemical Co., Ltd., acid anhydride equivalent 154, melting point 100° C. or higher)
  (A-4) Flexibility imparting agent
    (A-4-1) Polycaprolactone diol (product name: PLACCEL 208 by Daicel Corporation)
    (A-4-2) Polycaprolactone triol (product name: PLACCEL 308 by Daicel Corporation)
    (A-4-3) Polycarbonate polyol (product name: PLACCEL CD 205 PL by Daicel Corporation)
    (A-4-4) Polycarbonate polyol (product name: PLACCEL CD 220 PL by Daicel Corporation)
    (A-4-5) Acrylic block copolymer (product name: Nanostrength M22N by ARKEMA group)
  (A-5) Flexibility imparting agent for comparative example
    (A-5-1) Epoxy-modified silicone (product name: KF-105 by Shin-Etsu Chemical Co., Ltd.)
    (A-5-2) 1,4-butanediol (by Wako Pure Chemical Industries, Ltd.)
(B) Curing Accelerator
  (B-1) Tetra-n-butylphosphonium tetraphenylborate (product name: HISHICOLIN PX-4PB by Nippon Chemical Industries Co., LTD.)
  (B-2) Phenol novolac resin salt of 1,8-diazabicyclo[5.4.0]undecene-7 derivative [concentration: 42% by mass] (product name: U-CAT SA831 by San-Apro Ltd.)

Working Examples 1 to 16; and Comparative Examples 1 to 6, 9 to 21, 23, 24

Preparation of Heat-Curable Epoxy Resin Composition (1)

The components (A-1), (A-2), (A-3) and (A-4) or (A-5) shown in Tables 1 to 4, were combined with one another at the ratios shown therein, followed by performing prepolymerization by melting and mixing the same for 6 hours in a gate mixer heated to 85° C. The curing accelerator as the component (B) was then added to the prepolymer as the component (A), followed by melting and mixing the same for 5 minutes before cooling and solidifying the same. A cooled and solidified product thus obtained was then crushed to obtain the target epoxy resin composition in a powdery state.

Comparative Examples 7, 8, 22, 25

Preparation of Heat-Curable Epoxy Resin Composition (2)

The components (A-1), (A-2), (A-3) and (A-4) shown in Tables 2 to 4; and the component (B) were combined with one another at the ratios shown therein, followed by melting and mixing the same for 10 min in a gate mixer heated to 110° C. A solid or paste-like epoxy resin composition was then obtained by cooling a product thus obtained.

The following properties of the abovementioned epoxy resin composition were measured, and the results thereof are shown in Tables 1 to 4.

Handling Property of Composition

A handling property at the time of performing melting and mixing through the gate mixer, was evaluated based on the following standard.

○: Easily tabletable composition was obtained after cooling

×: Only composition difficult to be tableted was obtained after cooling

Room-Temperature Bending Strength, Bending Elastic Modulus

A mold manufactured in accordance with JIS-K6911 was used to perform molding under a condition of molding temperature: 175° C./molding pressure: 6.9 N/mm$^2$/molding time: 120 sec, followed by performing post curing at 180° C. for 1 hour. The bending strength and bending elastic modulus of the post-cured specimen were measured at a room temperature (25° C.).

Light Transmission

A sheet-shaped cured product having a thickness of 1 mm was prepared under the condition of molding temperature: 175° C./molding pressure: 6.9 N/mm$^2$/molding time: 120 sec. A spectrophotometer U-4100 (by Hitachi High-Technologies Corporation) was then used to measure the light transmission of such product at 600 nm.

Crack Resistance Test

DIP-14 pin packages (6 mm×19 mm×3 mm) were formed under the condition of molding temperature: 175° C./molding pressure: 6.9 N/mm$^2$/molding time: 120 sec. Further, after performing post curing at 180° C. for 1 hour, a total of 10 samples were obtained by performing separations at the lead sections. Next, each sample was subjected to a cycle of "−70° C. for 60 sec and then 220° C. for 30 sec" 10 times, followed by examining the number of the cracks that had occurred.

Glass-Transition Temperature (Tg)

A mold manufactured in accordance with EMMI standard was used to perform molding under the condition of molding temperature: 175° C./molding pressure: 6.9 N/mm$^2$/molding time: 120 sec, followed by performing post curing at 180° C. for 1 hour. The post-cured specimen was then subjected to a measurement by TMA (TMA 8310 by Rigaku Corporation).

TABLE 1

| Composition table (part by mass) | | | | Working example 1 | 2 | 3 | 4 | 5 | 6 |
|---|---|---|---|---|---|---|---|---|---|
| (A-1) | Epoxy resin | TEPIC-s | A-1-1 | 35.0 | 35.0 | 35.0 | 35.0 | 32.7 | 32.7 |
| (A-2) | Epoxy resin | jER-1001 | A-2-1 | 15.0 | 15.0 | 15.0 | 15.0 | | |
| | | EHPE-3150 | A-2-2 | | | | | 14.9 | 14.9 |
| (A-3) | Acid anhydride | RIKACID MH | A-3-1 | 50.0 | 50.0 | 50.0 | 50.0 | 52.4 | 52.4 |
| | | RIKACID TH | A-3-2 | | | | | | |
| (A-4) | Polycaprolactone polyol | PLACCEL 208 | A-4-1 | 5.0 | 10.0 | | | 5.0 | |
| | | PLACCEL 308 | A-4-2 | | | 5.0 | 10.0 | | 5.0 |
| (B) | Curing accelerator | HISHICOLIN PX-4PB | B-1 | 0.3 | 0.3 | 0.3 | 0.3 | 0.3 | 0.3 |
| | | U-CAT SA831 | B-2 | | | | | | |
| Condition | Prepolymerization | | | Yes | Yes | Yes | Yes | Yes | Yes |
| | (Molar number of all epoxy groups)/(Molar number of acid anhydride) | | | 1.3 | 1.3 | 1.3 | 1.3 | 1.3 | 1.3 |
| Evaluation results | Composition handling property | | | ○ | ○ | ○ | ○ | ○ | ○ |
| | Room temperature (25° C.) | Bending strength | MPa | 95 | 110 | 91 | 115 | 84 | 82 |
| | | Bending elastic modulus | MPa | 2460 | 2400 | 2610 | 2590 | 2640 | 2680 |
| | | Light transmission | % | 96 | 95 | 95 | 94 | 92 | 93 |
| | | Crack resistance test | % | 10 | 0 | 20 | 0 | 30 | 20 |

TABLE 2

| Composition table (part by mass) | | | | Comparative example 1 | 2 | 3 | 4 | 5 | 6 | 7 | 8 |
|---|---|---|---|---|---|---|---|---|---|---|---|
| (A-1) | Epoxy resin | TEPIC-s | A-1-1 | 35.0 | 35.0 | 35.0 | | 34.3 | 35.0 | 34.3 | 35.0 |
| (A-2) | Epoxy resin | jER-1001 | A-2-1 | 15.0 | 15.0 | 15.0 | 40.0 | 20.0 | 15.0 | 20.0 | 15.0 |
| | | EHPE-3150 | A-2-2 | | | | 30.0 | | | | |

TABLE 2-continued

|  |  |  |  |  |  |  |  |  |  |  |
|---|---|---|---|---|---|---|---|---|---|---|
| (A-3) | Acid anhydride | RIKACID MH | A-3-1 | 50.0 | 50.0 | 50.0 | 30.0 |  | 50.0 | 50.0 |
|  |  | RIKACID TH | A-3-2 |  |  |  |  | 45.6 |  | 45.6 |
| (A-4) | Polycaprolactone polyol | PLACCEL 208 | A-4-1 |  | 1.0 | 25.0 | 10.0 | 10.0 | 10.0 | 10.0 |
|  |  | PLACCEL 308 | A-4-2 |  |  |  |  |  |  |  |
| (B) | Curing accelerator | HISHICOLIN PX-4PB | B-1 | 0.3 | 0.3 | 0.3 | 0.3 | 0.3 |  | 0.3 |
|  |  | U-CAT SA831 | B-2 |  |  |  |  |  | 0.7 |  |
| Condition |  | Prepolymerization |  | Yes | Yes | Yes | Yes | Yes | Yes | No |
|  |  | (Molar number of all epoxy groups)/ |  | 1.3 | 1.3 | 1.3 | 1.3 | 1.3 | 1.3 | 1.3 |
|  |  | (Molar number of acid anhydride) |  |  |  |  |  |  |  |  |
| Evaluation results |  | Composition handling property |  | ○ | ○ | ○ | ○ | ○ | ○ | ○ |
|  | Room temperature (25° C.) | Bending strength | MPa | 72 | 73 | 53 | 80 | 81 | 83 | Failed to obtain molded product due to slow curing |
|  |  | Bending elastic modulus | MPa | 2500 | 2510 | 2390 | 2600 | 2820 | 2800 |  |
|  |  | Light transmission | % | 95 | 95 | 76 | 79 | 62 | 50 |  |
|  |  | Crack resistance test | % | 100 | 90 | 100 | 70 | 40 | 40 |  |

Last column (rightmost): Failed to obtain molded product due to numerous voids

|  |  |  |  | Comparative example |  |  |  |  |  |  |
|---|---|---|---|---|---|---|---|---|---|---|
| Composition table (part by mass) |  |  |  | 9 | 10 | 11 | 12 | 13 | 14 | 15 |
| (A-1) | Epoxy resin | TEPIC-s | A-1-1 | 18.5 | 42.0 | 35.0 | 35.0 | 41.2 | 23.8 | 22.7 |
| (A-2) | Epoxy resin | jER-1001 | A-2-1 | 13.0 | 21.0 | 15.0 | 15.0 |  | 35.7 |  |
|  |  | EHPE-3150 | A-2-2 |  |  |  |  |  |  | 28.5 |
| (A-3) | Acid anhydride | RIKACID MH | A-3-1 | 68.5 | 37.0 | 50.0 | 50.0 | 58.3 | 40.5 | 48.8 |
|  |  | RIKACID TH | A-3-2 |  |  |  |  |  |  |  |
| (A-4) | Polycaprolactone polyol | PLACCEL 208 | A-4-1 | 10.0 | 10.0 | 10.0 | 10.0 | 10.0 | 10.0 | 10.0 |
|  |  | PLACCEL 308 | A-4-2 |  |  |  |  |  |  |  |
| (B) | Curing accelerator | HISHICOLIN PX-4PB | B-1 | 0.3 | 0.3 |  | 6.0 | 0.3 | 0.3 | 0.3 |
|  |  | U-CAT SA831 | B-2 |  |  |  |  |  |  |  |
| Condition |  | Prepolymerization |  | Yes | Yes | Yes | Yes | Yes | Yes | Yes |
|  |  | (Molar number of all epoxy groups)/ |  | 0.5 | 2.2 | 1.3 | 1.3 | 1.3 | 1.3 | 1.3 |
|  |  | (Molar number of acid anhydride) |  |  |  |  |  |  |  |  |
| Evaluation results |  | Composition handling property |  | ○ | ○ | ○ | ○ | x | ○ | ○ |
|  | Room temperature (25° C.) | Bending strength | MPa | Molding failed due to extremely fast curing | 55 | Curing failed under this condition due to slow curing | Molding failed due to extremely fast curing | 72 | 90 | 64 |
|  |  | Bending elastic modulus | MPa |  | 2900 |  |  | 2760 | 2490 | 2670 |
|  |  | Light transmission | % |  | 85 |  |  | 95 | 53 | 81 |
|  |  | Crack resistance test | % |  | 80 |  |  | 80 | 30 | 100 |

TABLE 3

|  |  |  |  | Working example |  |  |  |  |  | Comparative example |  |  |  |  |  |  |
|---|---|---|---|---|---|---|---|---|---|---|---|---|---|---|---|---|
| Composition table (part by mass) |  |  |  | 7 | 8 | 9 | 10 | 11 | 12 | 16 | 17 | 18 | 19 | 20 | 21 | 22 |
| (A-1) | Epoxy resin | TEPIC-s | A-1-1 | 35.0 | 35.0 | 35.0 | 35.0 | 32.7 | 32.7 | 35.0 | 35.0 | 35.0 | 32.7 | 35 | 35.0 | 35.0 |
| (A-2) | Epoxy resin | jER-1001 | A-2-1 | 15.0 | 15.0 | 15.0 | 15.0 |  |  | 15.0 | 15.0 | 15.0 |  | 15.0 | 15.0 | 15.0 |
|  |  | EHPE-3150 | A-2-2 |  |  |  |  | 14.9 | 14.9 |  |  |  | 14.9 |  |  |  |
| (A-3) | Acid anhydride | RIKACID MH | A-3-1 | 50.0 | 50.0 | 50.0 | 50.0 | 52.4 | 52.4 | 50.0 | 50.0 | 50.0 | 52.4 | 50.0 | 50.0 | 50.0 |
| (A-4) | Polycarbonate polyol | PCL CD205PL | A-4-3 | 5.0 | 10.0 |  |  | 5.0 |  |  | 1.0 | 35.0 |  |  |  | 10.0 |
|  |  | PCL CD220PL | A-4-4 |  |  | 5.0 | 10.0 |  | 5.0 |  |  |  |  |  |  |  |
| (A-5) | Flexibility imparting agent for comparative example | KF-105 | A-5-1 |  |  |  |  |  |  |  |  |  |  | 5.0 |  |  |
|  |  | 1,4-butanediol | A-5-2 |  |  |  |  |  |  |  |  |  |  |  | 2.5 |  |
| (B) | Curing accelerator | HISHICOLIN PX-4PB | B-1 | 0.3 | 0.3 | 0.3 | 0.3 | 0.3 | 0.3 | 0.3 | 0.3 | 0.3 | 0.3 | 0.3 | 0.3 | 0.3 |
| Condition |  | Prepolymerization |  | Yes | Yes | Yes | Yes | Yes | Yes | Yes | Yes | Yes | Yes | Yes | Yes | No |
|  |  | (Molar number of all epoxy groups)/ |  | 1.3 | 1.3 | 1.3 | 1.3 | 1.3 | 1.3 | 1.3 | 1.3 | 1.3 | 1.3 | 1.3 | 1.3 | 1.3 |
|  |  | (Molar number of acid anhydride) |  |  |  |  |  |  |  |  |  |  |  |  |  |  |

TABLE 3-continued

|  |  |  | Working example | | | | | | Comparative example | | | | | | |
|---|---|---|---|---|---|---|---|---|---|---|---|---|---|---|---|
| Composition table (part by mass) | | | 7 | 8 | 9 | 10 | 11 | 12 | 16 | 17 | 18 | 19 | 20 | 21 | 22 |
| Evaluation results | Composition handling property | | ○ | ○ | ○ | ○ | ○ | ○ | ○ | ○ | ○ | ○ | ○ | ○ | x |
| | Room temperature (25° C.) | Bending strength MPa | 87 | 97 | 83 | 95 | 82 | 80 | 72 | 68 | 38 | 58 | 70 | 43 | Failed to obtain molded product due to numerous voids |
| | | Bending elastic modulus MPa | 2490 | 2450 | 2510 | 2510 | 2650 | 2640 | 2500 | 2510 | 2150 | 2710 | 2360 | 2600 | |
| | Glass-transition temperature | ° C. | 155 | 149 | 153 | 149 | 166 | 163 | 160 | 159 | 121 | 172 | 148 | 110 | |
| | Light transmission | % | 94 | 94 | 94 | 93 | 91 | 91 | 95 | 95 | 82 | 91 | 5 | 93 | |
| | Crack resistance test | % | 20 | 0 | 20 | 10 | 30 | 40 | 100 | 100 | 90 | 100 | 90 | 70 | |

TABLE 4

|  |  |  |  | Working example | | | | Comparative example | | |
|---|---|---|---|---|---|---|---|---|---|---|
| Composition table (part by mass) | | | | 13 | 14 | 15 | 16 | 23 | 24 | 25 |
| (A-1) | Epoxy resin | TEPIC-s | A-1-1 | 35.0 | 35.0 | 32.7 | 32.7 | 35.0 | 35.0 | 35.0 |
| (A-2) | Epoxy resin | jER-1001 | A-2-1 | 15.0 | 15.0 | | | 15.0 | 15.0 | 15.0 |
| | | EHPE-3150 | A-2-2 | | | 14.9 | 14.9 | | | |
| (A-3) | Acid anhydride | RIKACID MH | A-3-1 | 50.0 | 50.0 | 52.4 | 52.4 | 50.0 | 50.0 | 50.0 |
| (A-4) | Acrylic block copolymer | M22N | A-4-5 | 5.0 | 10.0 | 5.0 | 10.0 | 1.0 | 35.0 | 10.0 |
| (B) | Curing accelerator | HISHICOLIN PX-4PB | B-1 | 0.3 | 0.3 | 0.3 | 0.3 | 0.3 | 0.3 | 0.3 |
| Condition | Prepolymerization | | | Yes | Yes | Yes | Yes | Yes | Yes | No |
| | (Molar number of all epoxy groups)/(Molar number of acid anhydride) | | | 1.3 | 1.3 | 1.3 | 1.3 | 1.3 | 1.3 | 1.3 |
| Evaluation results | Composition handling property | | | ○ | ○ | ○ | ○ | ○ | ○ | x |
| | Room temperature (25° C.) | Bending strength | MPa | 89 | 100 | 81 | 90 | 68 | 90 | Failed to obtain molded product due to numerous voids |
| | | Bending elastic modulus | MPa | 2490 | 2450 | 2520 | 2460 | 2510 | 2300 | |
| | Glass-transition temperature | | ° C. | 159 | 155 | 172 | 168 | 159 | 143 | |
| | Light transmission | | % | 94 | 94 | 94 | 94 | 95 | 25 | |
| | Crack resistance test | | % | 10 | 0 | 20 | 10 | 90 | 10 | |

According to the results shown in Tables 1 to 4, it was confirmed that the present invention not only made pressure molding possible (tabletable) at a room temperature by performing prepolymerization, but was also able to improve the strength and crack resistance of the cured product under a room temperature by adding a polycaprolactone polyol, a polycarbonate polyol or an acrylic block copolymer.

Further, it was confirmed that an extremely small amount of a polycaprolactone polyol added would not improve the strength of the cured product, whereas an extremely large amount of such polycaprolactone polyol would not only result in no improvement in the strength of the cured product, but also lead to discoloration and turbidity immediately after performing molding. In addition, it was also confirmed that in the comparative examples, not only the molded product had been poorly colored, but an insufficient transparency had been exhibited as well.

Moreover, as shown by the results in Table 3, it was also confirmed that turbidity had occurred as a result of adding a flexibility imparting agent other than the component (A-4) of the present invention, and that even a small amount of such flexibility imparting agent would cause the glass-transition temperature to decrease in a significant manner.

What is claimed:
1. A heat-curable epoxy resin composition for optical semiconductor element encapsulation, comprising:
  (A) a prepolymer obtained by a reaction of components (A-1), (A-2), (A-3) and (A-4) at an epoxy group equivalent/acid anhydride group equivalent ratio of 0.6 to 2.0,
    (A-1) being a triazine derivative epoxy resin having not less than 3 epoxy groups in one molecule,
    (A-2) being at least one epoxy resin selected from the group consisting of a bisphenol A-type epoxy resin, a bisphenol F-type epoxy resin, a hydrogenated bisphenol A-type epoxy resin and an alicyclic epoxy resin,
    (A-3) being an acid anhydride curing agent in liquid form at 50° C., and
    (A-4) being a flexibility imparting agent selected from the group consisting of a polycaprolactone polyol, a polycarbonate polyol and an acrylic block copolymer; and
  (B) a curing accelerator comprised of an onium salt represented by the following formula 1:

$$X^+Y^- \quad (1)$$

wherein $X^+$ represents a cation selected from the group consisting of an aliphatic quaternary phosphonium ion, an aromatic quaternary phosphonium ion, an onium ion of 1,8-diaza-bicyclo [5.4.0] undeca-7-ene and an onium ion of an imidazole derivative, and $Y^-$ represents an anion selected from the group consisting of a tetrafluoroborate ion, a tetraphenylborate ion, a hexafluorophosphate ion, a bistrifluoromethylsulfonyl imide acid ion, a tris (trifluoromethylsulfonyl) carbonate ion, a trifluoromethanesulfonate ion, a halogenated acetic acid ion, a carboxylate ion and a halogen ion, wherein
(A-2) is added in an amount of 11 to 100 parts by mass with respect to 100 parts by mass of (A-1); (A-4) is added in an amount of 2 to 20 parts by mass with respect to 100 parts by mass of a total sum of (A-1), (A-2) and (A-3); and the component (B) is added in an amount of 0.05 to 5 parts by mass with respect to 100 parts by mass of a total sum of (A-1), (A-2), (A-3) and (A-4).

2. The heat-curable epoxy resin composition for optical semiconductor element encapsulation according to claim 1, wherein said curing accelerator as the component (B) is a phosphonium salt.

3. An optical semiconductor device having an optical semiconductor element encapsulated by the heat-curable epoxy resin composition for optical semiconductor element encapsulation as set forth in claim 2.

4. A method for manufacturing an optical semiconductor device, comprising a step of encapsulating an optical semiconductor element through transfer molding, using the heat-curable epoxy resin composition for optical semiconductor element encapsulation as set forth in claim 2.

5. An optical semiconductor device having an optical semiconductor element encapsulated by the heat-curable epoxy resin composition for optical semiconductor element encapsulation as set forth in claim 1.

6. A method for manufacturing an optical semiconductor device, comprising a step of encapsulating an optical semiconductor element through transfer molding, using the heat-curable epoxy resin composition for optical semiconductor element encapsulation as set forth in claim 1.

7. A method for producing a heat-curable epoxy resin composition for optical semiconductor element encapsulation, comprising:

a step of obtaining a prepolymer (A) by a reaction of components (A-1), (A-2), (A-3) and (A-4) at an epoxy group equivalent/acid anhydride group equivalent ratio of 0.6 to 2.0, (A-1) being a triazine derivative epoxy resin having not less than 3 epoxy groups in one molecule, (A-2) being at least one epoxy resin selected from the group consisting of a bisphenol A-type epoxy resin, a bisphenol F-type epoxy resin, a hydrogenated bisphenol A-type epoxy resin and an alicyclic epoxy resin, (A-3) being an acid anhydride curing agent in liquid form at 50° C., and (A-4) being a flexibility imparting agent selected from the group consisting of a polycaprolactone polyol, a polycarbonate polyol and an acrylic block copolymer; and a step of adding to said prepolymer (A) a curing accelerator (B) comprised of an onium salt represented by the following formula 1:

$$X^+Y^- \quad (1)$$

wherein $X^+$ represents a cation selected from the group consisting of an aliphatic quaternary phosphonium ion, an aromatic quaternary phosphonium ion, an onium ion of 1,8-diaza-bicyclo [5.4.0] undeca-7-ene and an onium ion of an imidazole derivative, and $Y^-$ represents an anion selected from the group consisting of a tetrafluoroborate ion, a tetraphenylborate ion, a hexafluorophosphate ion, a bistrifluoromethylsulfonyl imide acid ion, a tris (trifluoromethylsulfonyl) carbonate ion, a trifluoromethanesulfonate ion, a halogenated acetic acid ion, a carboxylate ion and a halogen ion, wherein
(A-2) is added in an amount of 11 to 100 parts by mass with respect to 100 parts by mass of (A-1); (A-4) is added in an amount of 2 to 20 parts by mass with respect to 100 parts by mass of a total sum of (A-1), (A-2) and (A-3); and said curing accelerator (B) is added in an amount of 0.05 to 5 parts by mass with respect to 100 parts by mass of a total sum of (A-1), (A-2), (A-3) and (A-4).

* * * * *